(12) United States Patent
Main

(10) Patent No.: US 6,701,297 B2
(45) Date of Patent: Mar. 2, 2004

(54) DIRECT INTERMEDIATE FREQUENCY SAMPLING WAVELET-BASED ANALOG-TO-DIGITAL AND DIGITAL-TO-ANALOG CONVERTER

(76) Inventor: Geoffrey Layton Main, 10111 Joy La., Vienna, VA (US) 22181

(*) Notice: Subject to any disclaimer, the term of this patent is extended or adjusted under 35 U.S.C. 154(b) by 293 days.

(21) Appl. No.: 09/796,493

(22) Filed: Mar. 2, 2001

(65) Prior Publication Data

US 2002/0152084 A1 Oct. 17, 2002

(51) Int. Cl.[7] .............................. G10L 19/00
(52) U.S. Cl. ................. 704/500; 704/201; 704/205
(58) Field of Search ............................... 704/500, 501, 704/502, 503, 584, 205, 201; 341/126, 118, 155

(56) References Cited

U.S. PATENT DOCUMENTS

| | | | |
|---|---|---|---|
| 5,495,554 A | 2/1996 | Edwards et al. | |
| 5,568,142 A | 10/1996 | Velazquez et al. | |
| 6,177,893 B1 * | 1/2001 | Velazquez et al. | 341/118 |
| 6,339,390 B1 * | 1/2002 | Velazquez et al. | 341/120 |
| 6,388,594 B1 * | 5/2002 | Velazquez et al. | 341/120 |
| 6,473,013 B1 * | 10/2002 | Velazquez et al. | 341/120 |
| 6,518,908 B2 * | 2/2003 | Boehm et al. | 341/155 |

OTHER PUBLICATIONS

Robert H. Walden, "Performance Trends for Analog-to-Digital Converters," IEEE Communications Magazine, 96–101, Feb. 1999.

Huawen Jin and Edward K. F. Lee, "A Digital–Background Calibration Technique for Minimizing Timing–Error Effects in Time–Interleaved ADC's, " IEEE Transactions on Circuits and Systems—II: Analog and Digital Signal Processing, 41(7):603–613 (Jul., 2000).

* cited by examiner

Primary Examiner—Susan McFadden

(57) ABSTRACT

A direct intermediate frequency sampling analog-to-digital and digital-to-analog converter comprised of (1) a bank of precision analog wavelet generator circuits, (2) synchronization circuits and calibration circuits, and (3) digital measurement circuits. In combination these circuits provide high dynamic range and high sample rate direct intermediate frequency sampling conversion between the discrete-time and continuous-time domains.

3 Claims, 9 Drawing Sheets

DIRECT INTERMEDIATE FREQUENCY SAMPLING WAVELET-BASED ANALOG-TO-DIGITAL AND DIGITAL-TO-ANALOG CONVERTER

CROSS-REFERENCE TO RELATED APPLICATIONS

This invention uses the basic wavelet-based analog-to-digital and digital-to-analog converter concept of my co-pending application Ser. No. 09/669,693, filed Sep. 26, 2000.

BACKGROUND

1. Field of Invention

The present invention relates to the field of electronics, and, more particularly, to the field of signal processing devices and methods for wireless communication.

BACKGROUND

2. Description of Prior Art

Analog-to-digital converter performance is limited by trade-offs between sampling rate and resolution in bits. Within the sampling rate range of approximately 1 million to 1 billion samples per second, these trade-offs are imposed firstly by timing jitter in the sampling process and secondarily by thermal noise in the sampling process. Prior art analog-to-digital converter designs, including time-interleaved designs, all suffer from the same limitations because they must take precisely timed short samples of the analog signal to be converted in order to provide precise, and therefore, high spurious-free dynamic range (SFDR) and high signal-to-noise ratio (SNR) conversion. Digital-to-analog converters are also subject to these limitations but are less severely impacted due to typically less strenuous SFDR and SNR requirements. In prior art, high-resolution, high sampling rate conversion also requires the sampling time of the analog signal to be short and therefore subject to thermal noise associated with the small amount of energy available from the signal in each sample. These limits on prior analog-to-digital conversion technology were recently described in Robert H. Walden, "Performance Trends for Analog-to-Digital Converters," IEEE Communications Magazine, 96–101, February 1999. Walden points out that progress in improving the sample rate to bit resolution trade-off has been slow, yielding only about 1.5 bits improvement over the previous eight years.

Time-interleaved converters use parallelism to reduce the sample rate required of each converter element in a parallel array. This arrangement does not reduce timing jitter for any particular sample and therefore does not improve the SNR. However, the clock skew between the parallel elements which impacts the SFDR can be improved somewhat through interpolation between the parallel elements. This is described in: Huawen Jin and Edward K. F. Lee, "A Digital-Background Calibration Technique for Minimizing Timing-Error Effects in Time-Interleaved ADC's," IEEE Transactions on Circuits and Systems—II: Analog and Digital Signal Processing, 41(7):603–613 (July, 2000).

Velazquez et al., U.S. Pat. No. 5,568,142, describes a hybrid filter bank analog-to-digital and digital-to-analog converter, which decomposes the analog signal into frequency sub-bands. This is similar to a wavelet decomposition into time and frequency bins. While this approach provides a means to increase bit resolution and compensate for nonlinearities, it lacks the ability to maintain precise synchronization between frequency subbands in the range of 1 million to 1 billion samples per second.

Edwards et al., U.S. Pat. No. 5,495,554, describes an analog circuit to generate a wavelet decomposition of a signal. This circuit has the advantage of being much smaller and much less power consuming than its digital counterpart. However, it also lacks the ability to maintain precise synchronization in the range of 1 million to 1 billion samples per second.

SUMMARY

The present invention provides a means for direct intermediate frequency sampling analog-to-digital and digital-to-analog signal conversion at combinations of sampling rates and bit resolutions previously not possible. This results in a combination of high sample rate, high SNR and high SFDR direct intermediate frequency sampling analog-to-digital and digital-to-analog conversion providing high sample rate and high bit resolution conversion not attainable with prior art.

OBJECTS AND ADVANTAGES

The present invention overcomes the bandwidth, SNR, and SFDR limitations of prior art analog-to-digital and digital-to-analog converter technology by decomposing or composing the analog signal into a set of wavelet functions rather than sampling it in the time domain. This wavelet decomposition allows for the detection and correction of extremely small timing errors and thus overcomes the timing jitter limitations of existing analog-to-digital converter technology. In addition, the wavelet decomposition integrates signal energy over much longer periods than the time domain sampling. As a result, each element of the wavelet-decomposed signal contains much more energy than each sample in a time domain sampling approach and therefore is much less affected by thermal noise. Also, the particular wavelet function, used to provide direct intermediate frequency sampling response in the present embodiment, greatly simplifies the required circuitry compared with the basic wavelet-based analog-to-digital and digital-to-analog converter concept of my co-pending application Ser. No. 09/669,693. Further objects and advantages may become apparent from consideration of the drawings and ensuing description.

DRAWING FIGURES

In the drawings, closely related figures have the same number but different alphabetical suffixes.

DESCRIPTION

Preferred Embodiment

Figure 1:
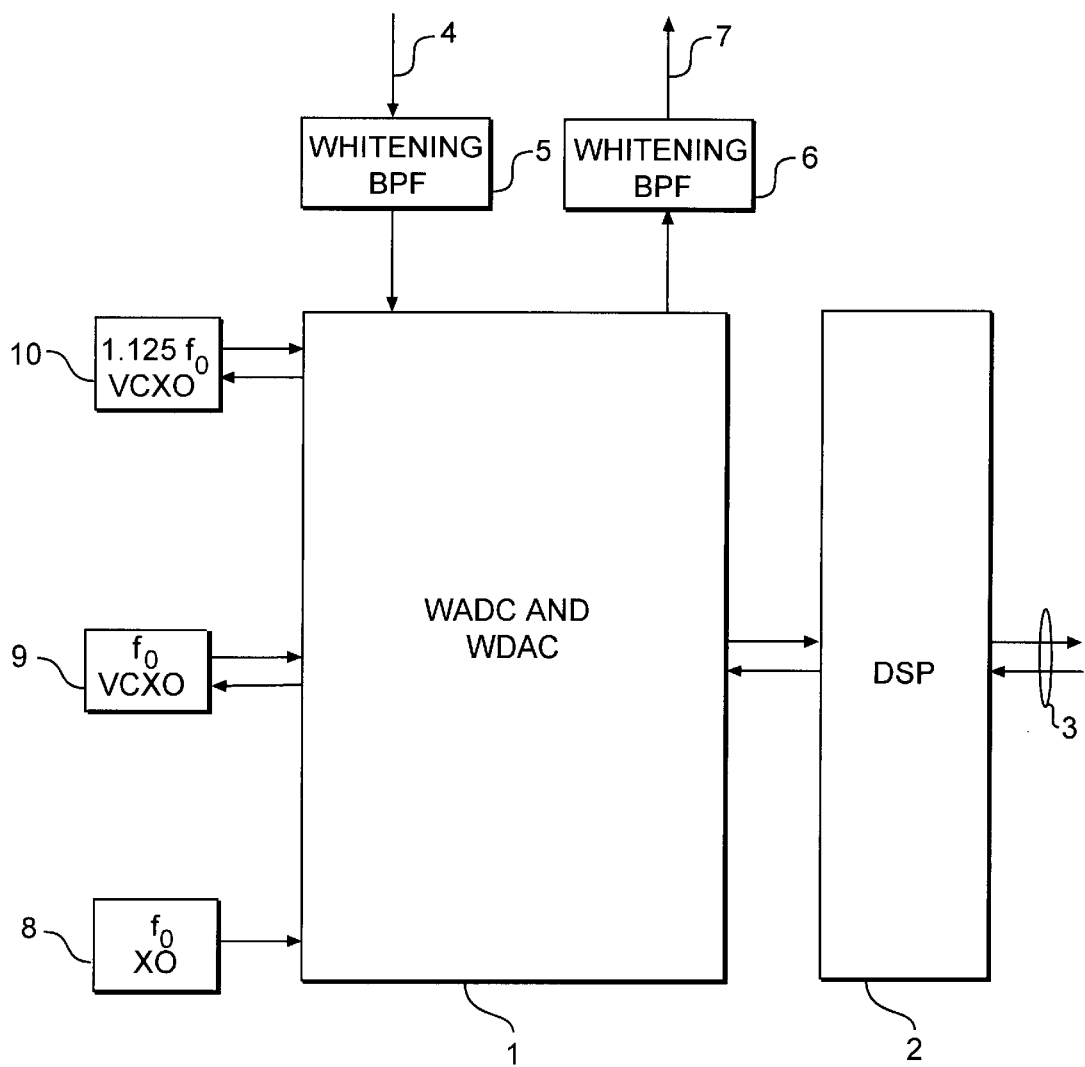
FIG. 1 is an overview schematic of the direct intermediate frequency sampling wavelet based analog-to-digital and digital-to-analog converter system comprising the present invention.

The present invention, in its preferred embodiment, is directed toward providing high resolution, high bandwidth direct intermediate frequency (IF) sampling conversion. Particular examples contained within this embodiment include a 70 MHz IF, 30 MHz Bandwidth (BW), 18 bit SFDR and SNR design with both 100 million samples per second (MSPS), and 200 MSPS variations. This particular design is well suited for application to wide-band software defined radio (SDR) wireless basestations.

The elements of the present invention are the direct IF sampling wavelet analog-to digital (WADC) and wavelet digital-to-analog (WDAC). The WADC and WDAC 1 may be incorporated in a single integrated circuit, which may or may not be integrated with the other circuit elements of FIG. 1. The WADC and WDAC contain only circuit elements which are easily implemented in standard integrated circuit fabrication processes such as complementary metal oxide semiconductor (CMOS). In most embodiments, the WADC and WDAC will be integrated with the digital signal processor (DSP) 2 as a single integrated circuit due to the compatibility of the fabrication processes and cost advantages of doing so.

The WADC and WDAC Overview Schematic

The operation of the WADC and WDAC 1 requires that it be mated with the DSP 2 which carries out calculations necessary to maintain precise synchronization and calibration. However, the synchronization and calibration computational load imposed on the DSP 1 is not significant compared with the computational load imposed by the typical signal processing application such as software defined radio (SDR) demodulation and modulation. Therefore, the DSP 1 operates as part of both the conversion and signal processing functions. This provides a significant advantage in that a DSP is almost always present for signal processing applications associated with analog-to-digital or digital-to-analog conversion and can, therefore, serve a dual purpose.

The DSP 2 delivers the demodulated digital data 3 extracted from the analog IF signal 4 or works in conjunction with the WDAC 1 to modulate the incoming digital data 3 onto the outgoing analog IF signal 7. The incoming analog IF signal 4 or the outgoing analog IF signal 7 must be in an IF form for compatibility with the wavelet structure of the WADC and WDAC 1. While this is a requirement for the present invention, it is also an advantage for most envisioned applications of the present invention such as SDR because it eliminates the need to base-band the analog signals, reducing the total component count and cost. The wavelet structure used in the WADC and WDAC 1, which will be discussed further below, has non-flat frequency response in the IF band being converted. Whitening band pass filters (Whitening BPFs) 5 and 6 serve the dual purposes of flattening the analog IF band response and also blocking frequencies outside of the analog IF band. While the wavelet frequency response is non-flat in magnitude, its phase response is exactly linear and therefore easily compensated for by the whitening element of the Whitening BPFs 5 and 6 producing a combined flat frequency response and linear phase response in the analog IF band of interest. The band pass elements of the Whitening BPFs 4 and 7 are subject to the same limitations on flatness and linear phase response as any other analog IF filter used in radio systems and is not a significant concern. In most applications, the whitening BPFs 5 and 6 will be custom designed surface acoustic wave (SAW) devices that are readily obtainable and inexpensive.

The crystal oscillator (or XO) 8 provides the basic synchronization and basic phase stability required by the overall system. The voltage controlled crystal oscillators (VCXOs) 9 and 10 are held in stable phase relationships to the XO 8 and provide the remainder of the stable phase signals required by the system. These oscillators do not need to be tunable; their only role is to provide stable phase sinusoidal signals at fixed frequencies. XOs and VCXOs are inexpensive and easily provide very high phase stability if tuning is not required as in the present invention. Thus they are chosen for the present embodiment. However, advances in highly stable integrated circuit oscillators may make it possible to include the functionality of XO 8 and VCXOs 9 and 10 on the WADC and WDAC integrated circuit 1. The same advances would also allow the inclusion of some or all of the functionality of the Whitening BPFs 5 and 6 on the WADC and WADC integrated circuit 1. This invention anticipates the inclusion of some or all of the elements of FIG. 1 on a single integrated circuit.

The particular embodiment shown in FIG. 1 specifies oscillators at frequencies $f_0$ and $1.125\, f_0$. This combination of frequencies enables the construction of wavelets and reference signals well suited to the required synchronization and calibration of the WADC and WDAC circuitry. The benefits of this combination of frequencies will be explained in conjunction with the description of the wavelet structure, and the synchronization and calibration methodology. This set of frequencies produces a useful analog IF band ranging from approximately $0.825\, f_0$ to $1.275\, f_0$ with only 2.5 dB magnitude variation to be corrected by the whitening BPFs. An $f_0$ of 66.67 MHz will produce an IF band of 55–85 MHz and a digital sample rate of 100 or 200 MSPS. The present invention is scalable in frequency bandwidth and digital sample rate (both up and down). This particular embodiment is also scaled for currently inexpensive integrated circuit fabrication technologies and will support at least a 18 bit spurious-free dynamic range (SFDR) and a 18 bit signal-to-noise ratio (SNR) simultaneously with the high bandwidth and data rates mentioned above.

The Wavelet Analog-to-Digital Converter Schematic

Figure 2:
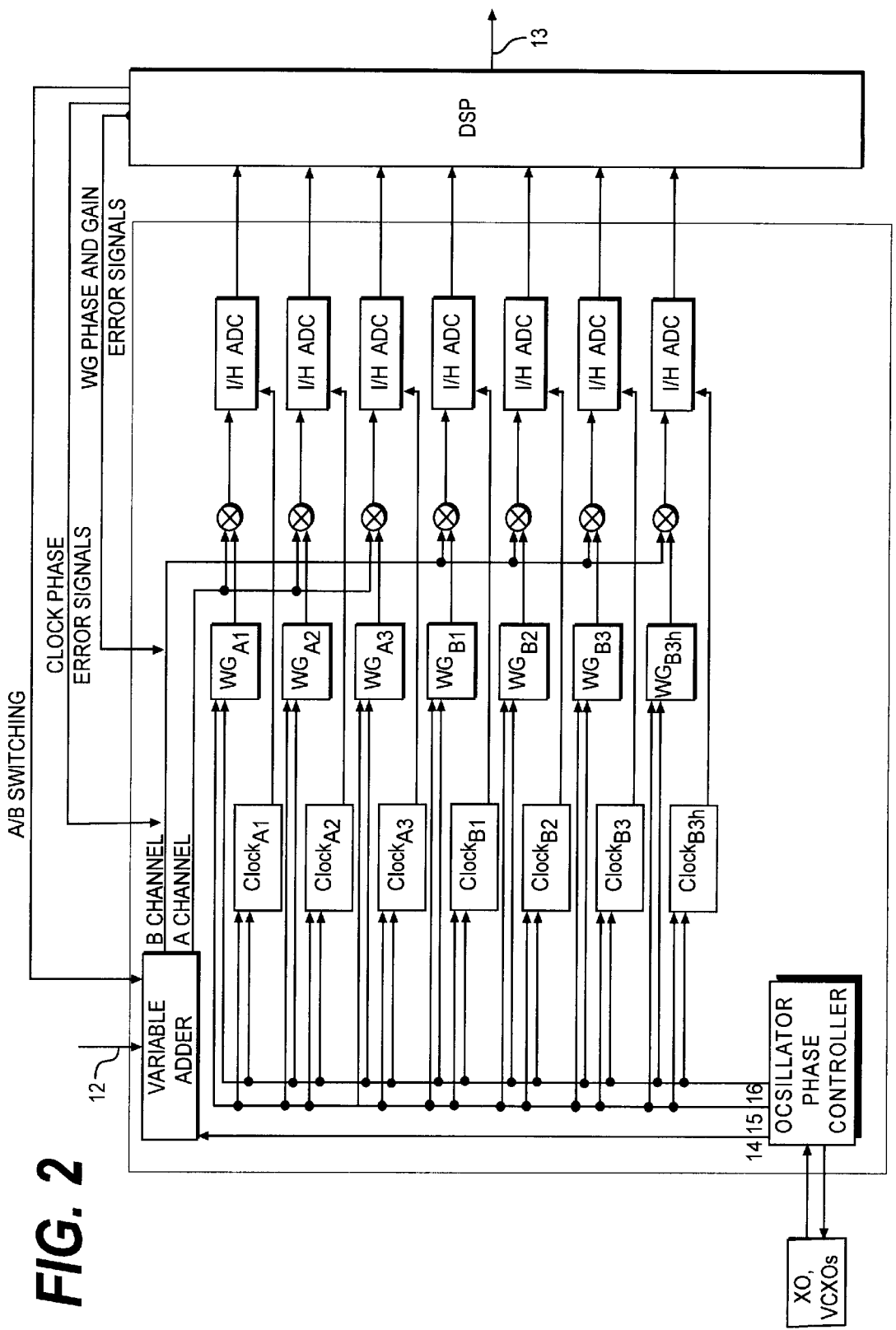
FIG. 2 is a schematic of the direct intermediate frequency sampling wavelet analog-to-digital converter (WADC) circuit of the present invention.

The Wavelet Analog-to-Digital Converter (WADC) schematic is set forth in FIG. 2. It creates the wavelets required to decompose the input analog IF signal and multiplies them by the input analog IF signal, integrates the product and digitizes it.

The variable adder receives the input analog IF signal 12 after it has been band pass filtered to the IF band and "whitened" to compensate for the frequency spectrum of the wavelets. The variable adder also receives the reference signal, 14, which is a pure sinusoidal at a frequency of 1.125 $f_0$. The function of the variable adder is to interleave the input analog IF signal and the reference signal into its output A and B channels. This interleaving provides the basis for synchronization and calibration within the WADC. The core of the WADC is the parallel wavelet generator (WG) and integrate-and-hold-analog-to-digital (I/H ADC) pathways. These pathways take the signal arriving on the A or B channel, multiply it by the wavelet, integrate the product and digitize the product. Of the seven pathways, three are required for the A channel, three are required for the B channel, and one is required to aid in correcting the synchronization and calibration between the A and B channels. The clocks provide timing pulses that indicate the end of a wavelet cycle and signal the I/H ADC to digitize its integrated product. A crucial attribute of the present invention is that these timing pulses need not be precise and that any unacceptable error can be detected and corrected by a digital algorithm implemented in the DSP. At the end of each wavelet cycle there is relatively little integrated product which allows for relatively large clock errors without creating any significant error in the wavelet convolution. Each the A and B channels have three pathways to provide the required wavelet overlap. Although a three overlapping wavelet design is chosen in this particular embodiment, the present invention anticipates other overlap ratios dependent on interrelated factors of sample rates, frequencies, bit resolution and available circuit fabrication technologies.

The digital outputs of these pathways are presented to the DSP for further processing which provides phase and gain error signals back to the WGs and I/H ADCs, clock phase errors back to the clocks, and the A/B channel switching signals back to the variable adder. The demodulated data, 13, is the final output of the DSP.

The XO and VCXOs in FIG. 2 are the same as those represented in FIG. 1 and are grouped together here for illustration simplicity. The XO and VCXOs are connected to the Oscillator Phase Controller (OPC) within the WADC. The OPC maintains high relative phase stability (about one part in $10^{-7}$) between the XO and VCXOs. Only a high relative phase stability is needed. There is no special requirement for high absolute phase stability in this invention; that of standard XOs and VCXOs is more than sufficient. Also, the relative phase angles of the oscillators need only be approximate as long as the high relative phase stability is maintained. The outputs of the OPC are the sine waves produced by the oscillators and phase controlled by the OPC at frequencies and relative phases of: 1.125 $f_0$ at 0°, 14; $f_0$ at 0°, 15; and $f_0$ at 90°, 16.

The Wavelet Digital-to-Analog Converter Schematic

Figure 3:
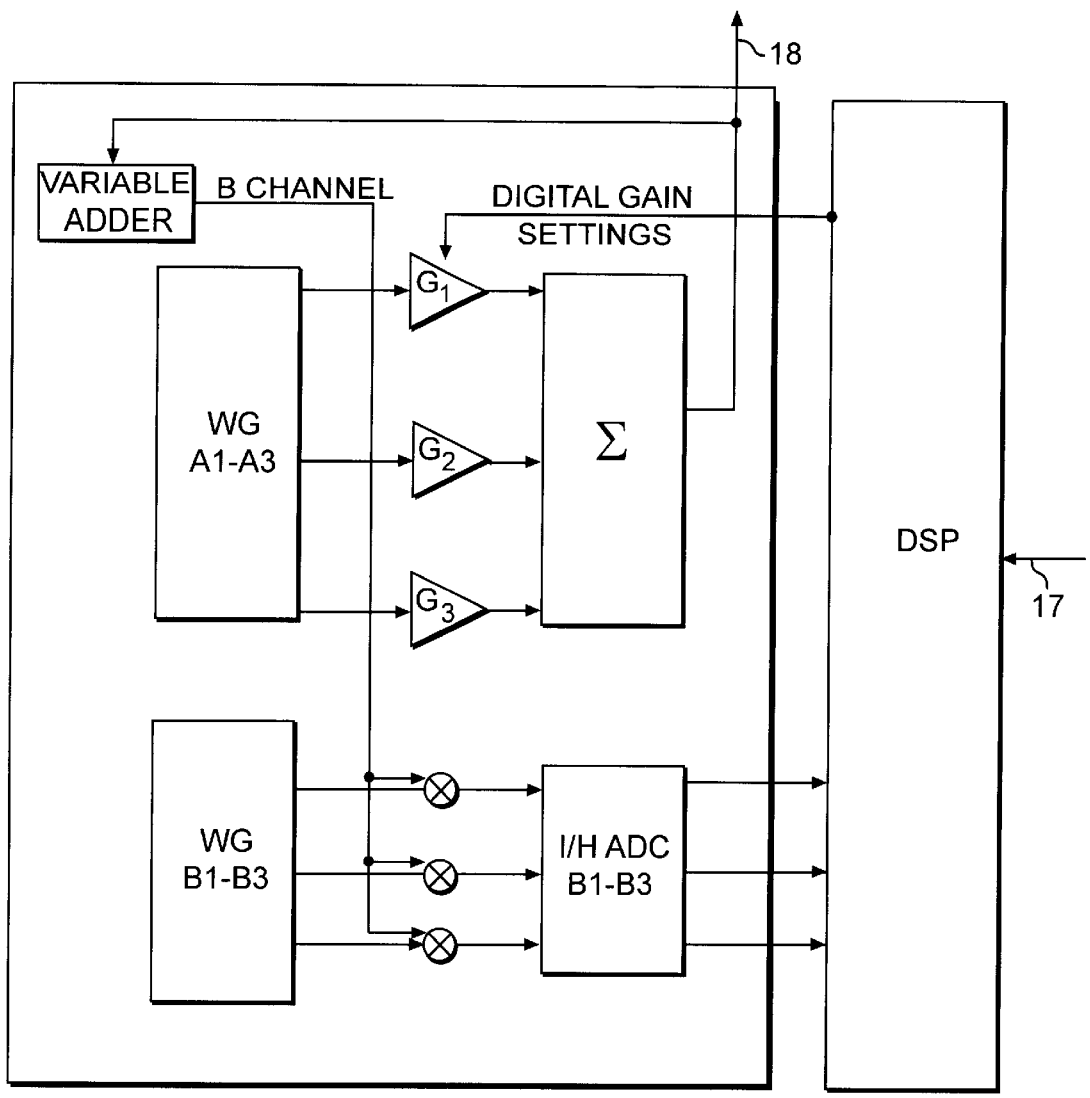
FIG. 3 is a schematic of the direct intermediate frequency sampling wavelet digital-to-analog converter (WDAC) circuit of the present invention.

The Wavelet Digital-to-Analog Converter (WDAC) schematic, as it differs from the WADC schematic of FIG. 2, is described in FIG. 3. It creates the wavelets required to compose the output analog IF signal from the input digital signal. The WDAC circuit uses most, but not all, of the elements of the WADC with a very similar structure. For simplex operation the WDAC can simply use a subset of the WADC elements. If duplex operation is desired, the additional elements are placed on the same integrated circuit and use the same oscillators and DSP.

In FIG. 3, input digital data 17, is presented to the DSP and the resulting analog output composite signal 18 flows to a whitening BPF to remove out-of-band frequency components and to compensate for the frequency response of the wavelet of as mentioned above.

The WG bank A1–A3 is used to construct the output composite signal 18 by digitally adjusting the gain applied to each wavelet coming from it and summing the results. This is accomplished by changing the gain of each amplifier $G_1$ through $G_3$ during the near zero period at the end of each wavelet cycle. Again, timing is not critical because the wavelet is contributing little the analog output composite signal during this period. The composite signal 18 is returned to the variable adder (in place of the analog input signal of the WADC) and interleaved with the reference signal as in the WADC. Only the interleaved signal on the B channel is used. The A channel is not required. As in the WADC, the interleaved reference signal on B pathways is used to synchronize and calibrate (using the phase and gain error signals) the B pathway WGs and I/H ADCs. In contrast, the interleaved composite signal on the B channel is used to synchronize and calibrate (using the phase and gain errors signals) the A pathway WGs and I/H ADCs. A key concept here is that the intended output analog composite signal is known, and can, therefore, be used to calibrate the A pathway WGs and I/H ADCs. This makes the WDAC design less complex than the WADC design.

The Wavelet Function

Figure 4A:
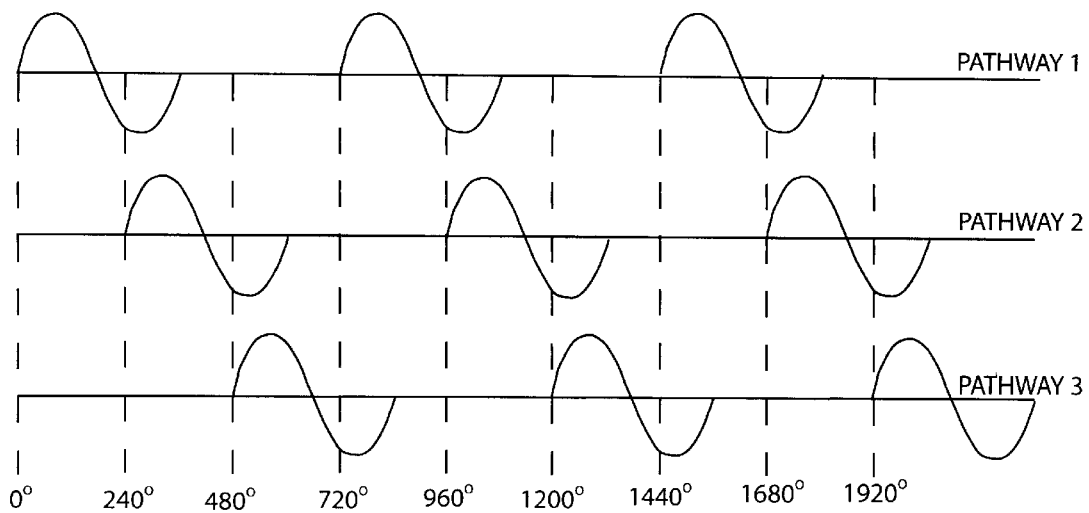
FIG. 4A is the mathematical description of the wavelet employed by the present invention.

FIG. 4A illustrates a wavelet produced by the WGs and used to accomplish the analog-to-digital and digital-to-analog conversion of the present invention. The wavelet is specified by, $$w(t)=\sin(2\pi f_0 t), \qquad (1)$$

on the interval $[0,1/f_0]$ and w(t)=0 elsewhere. In FIG. 4A, the pattern of wavelets generated on each of the three pathways of each channel is illustrated. The pathways are phase shifted 240° from each other and produce the wavelets in a 50% duty cycle as illustrated. The 50% duty cycle is effectively created by the sample and hold timing of the I/H ADC circuits to provide adequate time for their digitization operation and does not require the WG circuits to interrupt their precisely phase and magnitude controlled sine wave output.

There are two attributes of this wavelet important to the present invention:

First, it allows the WGs produce the wavelet w(t) in the repeating pattern of equation (1) and the wavelet exists by virtue sampling the integral of product of the signal and w(t) at the points $2n/f_0$ where n is an integer. This purely harmonic structure of the repeating pattern described by equation (1) allows the WG circuits to be constructed of current radio frequency microelectronic fabrication technology and produce extremely accurate wavelet structures.

Second, the wavelet described above exhibits a near-zero amplitude region around each point $n/f_0$. The shape of this region is described by $$w(t) \cong (2\pi f_0 t). \qquad (2)$$

As a consequence, errors in sampling timing, $\Delta t$, produce a normalized wavelet integral measurement error of approximately $$\int w(t)dt \cong (2\pi f_0 \Delta t)^2/4. \qquad (3)$$

In the specific converter embodiment discussed here, it is assumed that desired SNR and SFDR are both 18 bits thus requiring integral errors be kept below $4 \times 10^{-6}$. According to equation (3), this requires only that $$2\pi f_0 \Delta t \leq 4 \times 10^{-3}. \qquad (4)$$

For the specific case of a 70 MHz IF, 30 MHz BW, 100 or 200 MSPS converter discussed above in which $f_0$=66.67 MHz, the sampling timing error, $\Delta t$, need only remain under about 10 picoseconds which is well within the capability of current radio frequency microelectronics fabrication technologies. The sampling timing error, $\Delta t$, is the timing jitter of the clocks controlling the sampling of each I/H ADC. This is the basis for precision wavelet decomposition and composition without correspondingly precise sample timing.

Figure 4B:
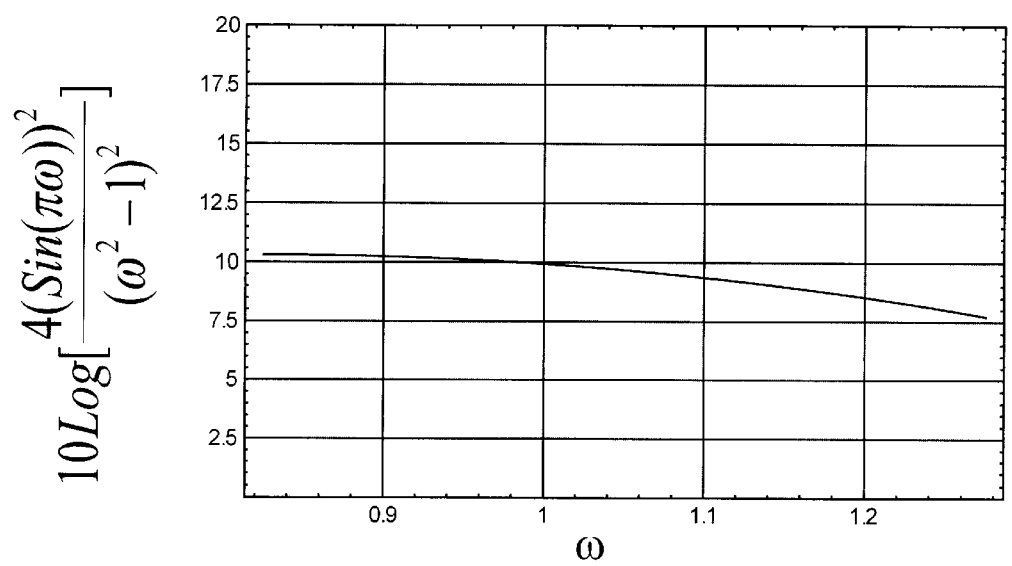
FIG. 4B is the frequency spectrum of the wavelet employed by the present invention.

FIG. 4B shows the frequency spectrum of the wavelet structure identified above. The region covering a non-dimensional frequency, $\omega$, of 165/200 to 255/200 is shown to correspond to IF band of 55 MHz to 85 MHz following the example above. Within this band, the magnitude variation is only 2.5 dB and the phase response is linear (with group delay, $-(d\theta/d\omega)=1/(2\,f_0)$). A Whitening BPF is easily constructed to compensate for, or "whiten", the frequency response in that region.

Wavelets can be tailored to optimize various useful properties. Most of modern wavelet theory is focused on producing orthogonal and compact wavelets optimized for digital signal processing where the signal of interest has already been digitized. In contrast, this wavelet design is optimized for the analog signal processing described above. It is compact in the time domain, but not in the frequency domain. And, it does not form an orthogonal basis set for the analog IF signal being processed. It does, however, span the analog IF signal space and therefore retains all the information about the signal. Requiring orthogonality and frequency compactness would decrease the wavelet's compactness in the time domain and, therefore, require many more wavelet generator pathways in the WADC and WDAC design. In addition, such a wavelet would require a much more complex analog wavelet generator circuit. If a compact orthogonal wavelet representation of the signal is required, it can and should be created in the digital domain using the DSP.

Signal Flow Representations

Figure 5A:
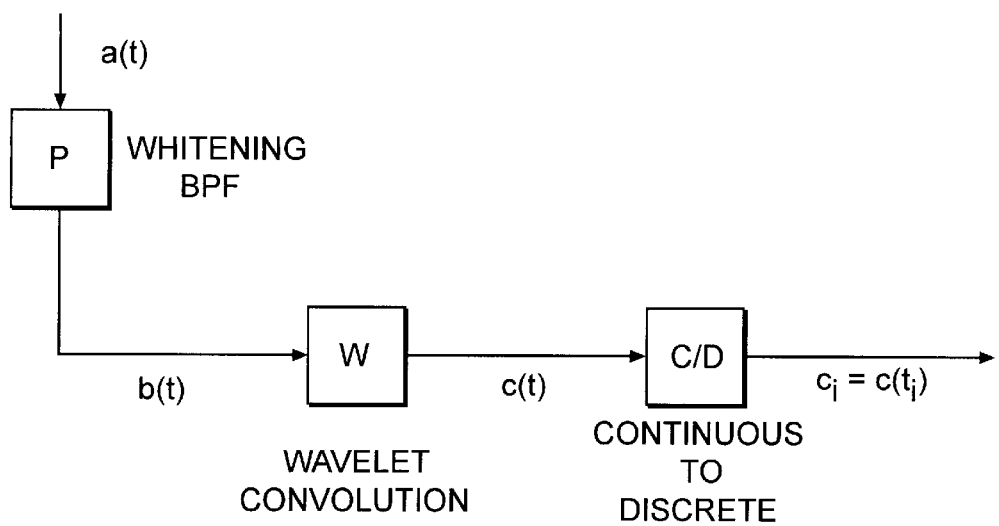
FIG. 5A is a block diagram representing the signal flow through the direct intermediate frequency sampling wavelet analog-to-digital converter (WADC).

FIG. 5A describes the signal flow through the WADC beginning with the input analog IF signal, a(t), and ending with the digital output data, $c_i$. The Whitening BPF is denoted by P, the band-limited signal from P is denoted by b(t). The remainder of the WADC operation is described by a wavelet convolution, W, producing c(t) and a continuous-to-discrete converter, C/D, producing $c_i$=c($t_i$). A key point is that c(t) does not exist as an actual signal in the WADC because the convolution, and discretization are not performed by separate circuits. The function c(t) is identified to clarify the signal flow. The Whitening BPF, P, can be represented as, $$b(t) = \int_{-\infty}^{\infty} a(\tau)p(t-\tau)d\tau. \quad (7)$$

The wavelet convolution, W, can be represented as, $$c(t) = \int_{-\infty}^{\infty} b(\tau)w(t-\tau)d\tau. \quad (8)$$

The continuous-to-discrete converter and wavelet convolution together can be represented as $$c_i = c(t_i) = \int_{-\infty}^{\infty} b(\tau)w(t_i-\tau)d\tau. \quad (9)$$

The Fourier transforms of equations (7) and (8) are:

$$B(\omega)=P(\omega)A(\omega), \quad (10)$$

and $$C(\omega)=W(\omega)B(\omega). \quad (11)$$

These can be combined to produce $$C(\omega)=P(\omega)W(\omega)A(\omega). \quad (12)$$

It should be noted here that $C(\omega)$, which is the Fourier transform of c(t), is also the Discrete Fourier transform of $c_i$ in the limit of a large number of samples, i.

Figure 5B:
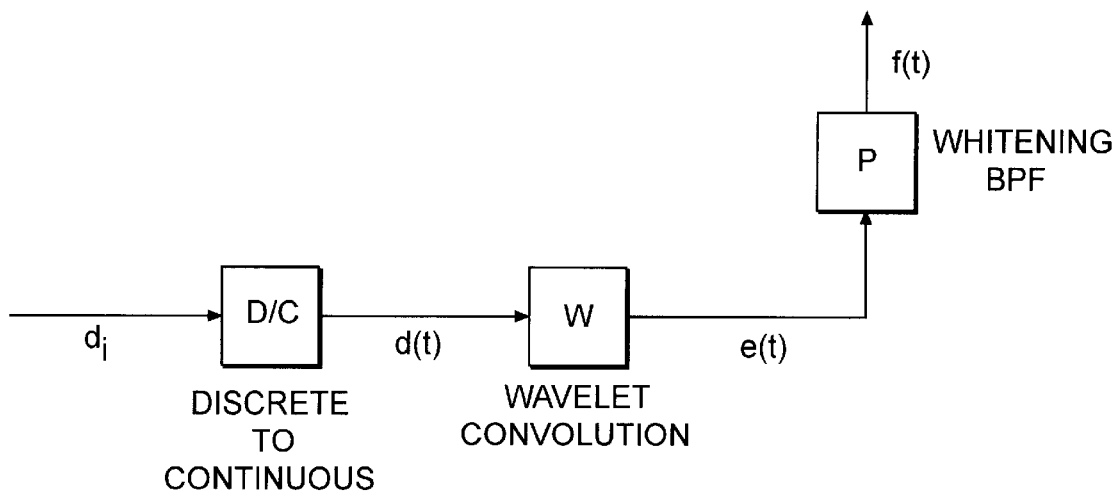
FIG. 5B is a block diagram representing the signal flow through the direct intermediate frequency sampling wavelet digital-to-analog converter (WDAC).

FIG. 5B describes the signal flow through the WDAC beginning with the input discrete signal, $d_i$. A discrete-to-continuous converter, D/C, produces d(t) such that d($t_i$)=$d_i$. It should be noted that a unique definition of d(t) exists by virtue of requiring d(t) to be band-limited within the Nyquist criteria for the sample rate of $d_i$. Under this condition, and in the limit of a large number of samples, $d_i$, the Fourier transform of d(t) and the discrete Fourier transform of the sequence, $d_i$, are identical and denoted by $D(\omega)$. The wavelet convolution, W, produces e(t) from d(t). A key point, again, is that d(t) does not exist as an actual signal in the WDAC because the discrete-to-continuous operation and wavelet convolution are not separate circuits. The function d(t) is identified to clarify the signal flow. The Whitening BPF is again denoted by P and is identical to the Whitening BPF on the WADC side because the frequency response of the both the WADC and WDAC wavelet convolutions are identical. The signal flow in FIG. 5B ends with the analog IF output signal, $f$(t).

The Whitening BPF, P, can be represented as, $$f(t) = \int_{-\infty}^{\infty} e(\tau)p(t-\tau)d\tau. \quad (13)$$

The wavelet convolution, W, can be represented as, $$e(t) = \int_{-\infty}^{\infty} d(\tau)w(t-\tau)d\tau. \quad (14)$$

The Fourier transforms of equations (13) and (14) are:

$$F(\omega)=P(\omega)E(\omega), \quad (15)$$

and, $$E(\omega)=W(\omega)D(\omega). \quad (16)$$

These can be combined to produce, $$F(\omega)=P(\omega)W(\omega)D(\omega). \quad (17)$$

In the analog IF frequency band of interest, $P(\omega)$ is designed so that $$\|P(\omega)W(\omega)\|=1. \quad (18)$$

This is what is called "whitening" in the Whitening BPF. The combination of the Whitening BPF and the wavelet convolution has created an effective wavelet that is compact in the frequency domain, and nearly flat in its band pass frequency range. This allows the sequence, $c_i$, to be treated as a($t_i$) with a delay according to $P(\omega)W(\omega)$ and $f(t_i)$ to be treated as $d_i$, with a delay according to $P(\omega)W(\omega)$. The result is an effective wavelet with the desired signal processing properties but an actual wavelet with ideal analog generation and convolution properties.

Sampling Clock Circuits

Figure 6A:
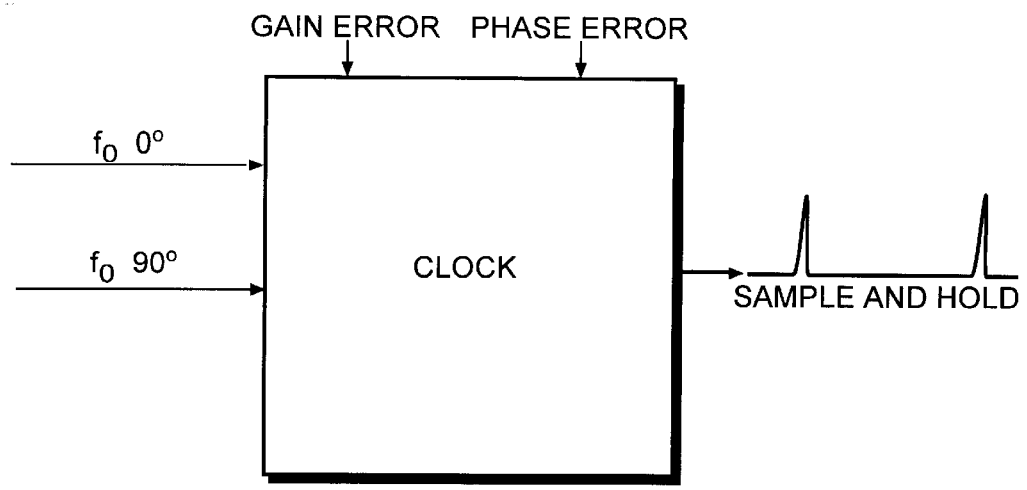
FIG. 6A is a functional diagram of the sampling clock circuit comprising elements of the WADC and WDAC circuits.

The sampling clock circuits provide the sample and hold signal shown in FIG. 6A to mark the end of one wavelet and the beginning of the next wavelet. The sample and hold signal need only provide the approximate end/beginning point as discussed within the accuracy constraints imposed by equation (4).

Figure 6B:
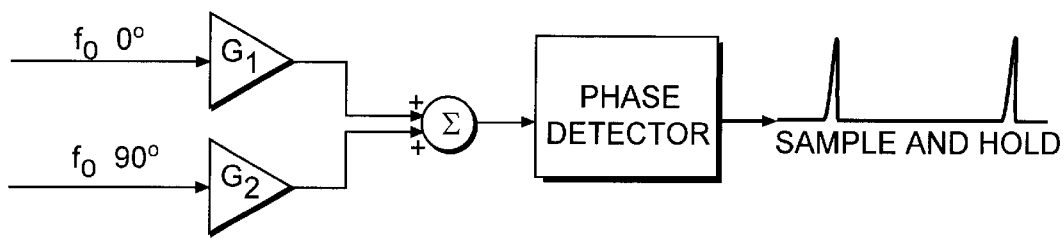
FIG. 6B is a schematic of the sampling clock circuit.
Figure 6B:
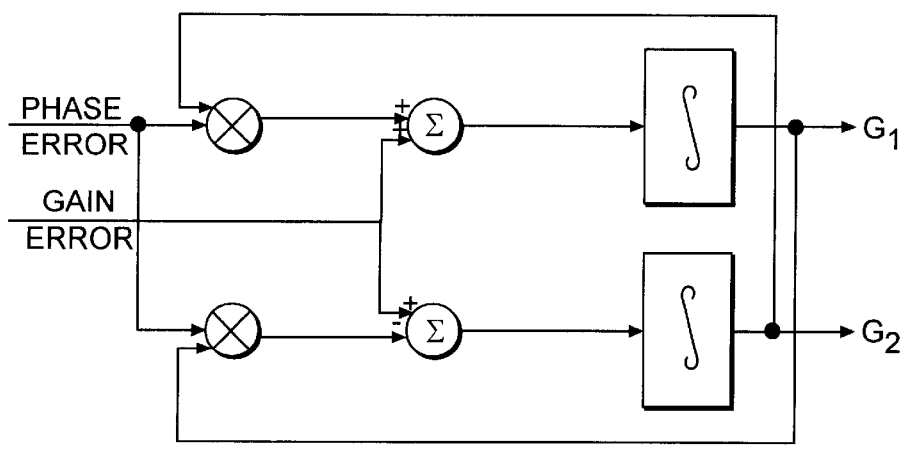

The design of the clock circuit is shown in FIG. 6B. It creates the arbitrary phase and gain sinusoidal signal by adjusting the gains, $G_1$ and $G_2$ of the two nearly orthogonal input sine waves and summing them. The circuit generates the gains, $G_1$ and $G_2$, in response to phase error, $\delta$, and gain error, $\epsilon$, according to:

$$\dot{G}_1 = \epsilon + \delta G_2, \tag{19}$$

and $$\dot{G}_2 = \epsilon - \delta G_1. \tag{20}$$

Following the precisely phase controlled sinusoidal signal is a fixed phase detector which provides the clock output sample and hold signal. The clock is thus adjusted by changing the phase and gain error signals provided by the DSP. The method by which the DSP calculates the precise clock corrections is described in conjunction with the other synchronization and calibration methods below under the variable adder section.

Wavelet Generator

Figure 7A:
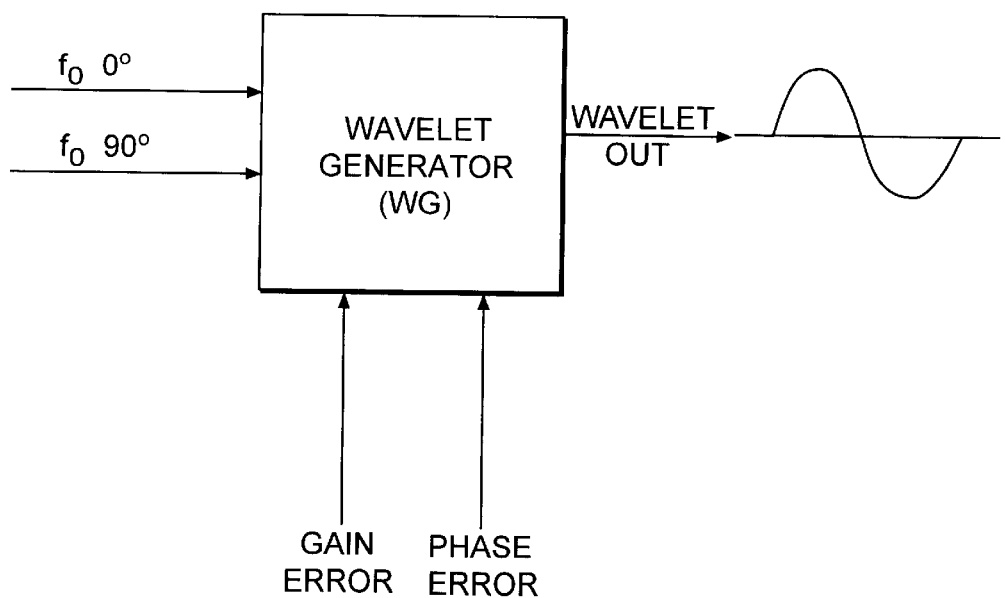
FIG. 7A is a functional diagram of the wavelet generator (WG) circuit comprising elements of the WADC and WDAC circuits.

The wavelet generator (WG), used in both the WADC and WDAC circuits, is described in FIG. 7A. The output of the WG is the wavelet described above, occurring in the repeating pattern of equation (1). The inputs to the WG are: pure sine waves at frequency $f_0$ with two phases approximately 90° apart, and gain error and phase error signals provided by the DSP.

Figure 7B:
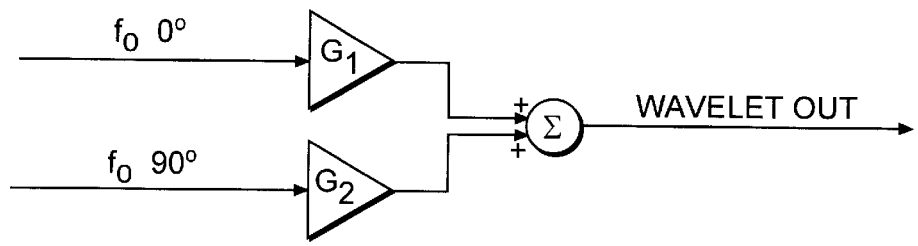
FIG. 7B is a schematic of the WG circuit.
Figure 7B:
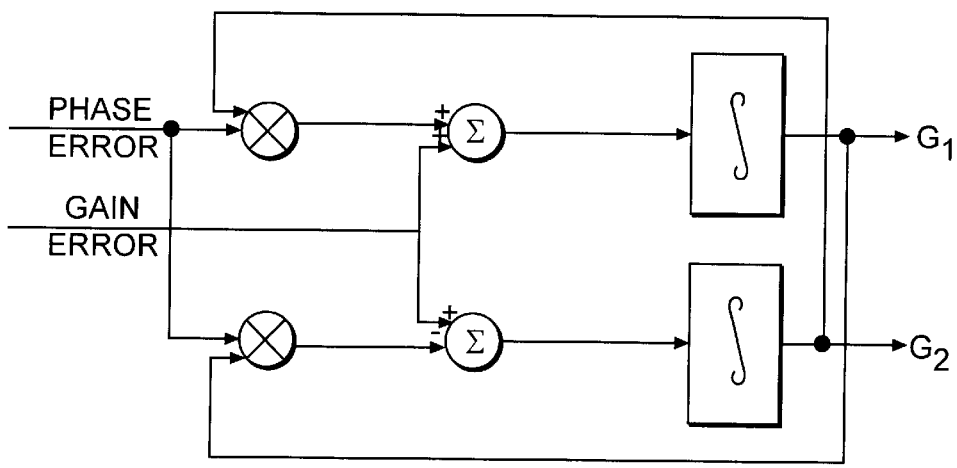

The design of the WG is shown in FIG. 7B. It constructs the repeating wavelet pattern of equation (1) by adjusting the phases and gains of the input pure sine waves at the frequency $f_0$. It operates in the same manner as the clock circuit shown in FIG. 6B except that there is no phase detector. The phase and gain error signals of the wavelet, relative to the signal it will be multiplied with, are provided by the DSP according to an algorithm explained in connection with the description of the variable adder circuit.

Variable Adder

Figure 8A:
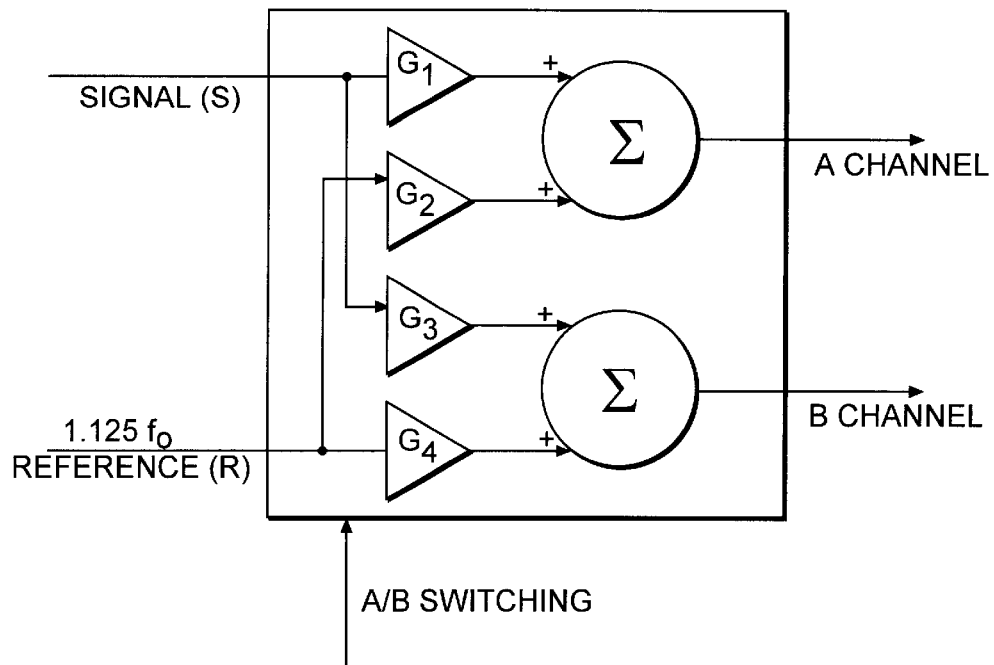
FIG. 8A is a schematic of the variable adder circuit comprising part of the WADC circuit.

The variable adder shown in FIG. 8A interleaves the incoming analog IF signal (S) with a reference signal (R), which is purely sinusoidal at a frequency of $1.125 f_0$, into its output A and B channels. The variable adder accomplishes the interleaving by varying the gains, $G_1$, $G_2$, $G_3$, and $G_4$, in a cycle based on the synchronization signal. The cycle timing need not precise because the outputs of the A and B channels are not used during the transition between states and are recalibrated and resynchronized during each state. The gains switch between 0 and 1 during the transition between states and also need not be precise. However, the gains must be constant during each state and the 0 gain state must not allow signal transmission within the dynamic range of the system.

Figure 8B:
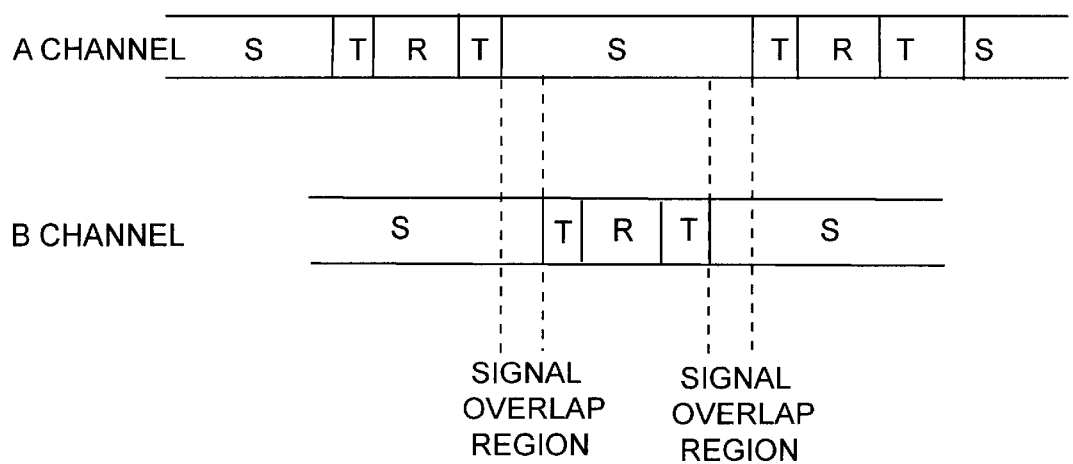
FIG. 8B is a timing diagram for the variable adder.

The A and B channel interleaving pattern is shown in FIG. 8B. The signal regions, S, on each channel are used to digitize the signal. The reference region, R, of each channel is used to synchronize and calibrate the wavelet pathways within that channel. The signal overlap regions between the channels are used to synchronize and calibrate each channel relative to the other. The interleaving cycle must be long enough to allow for accurate synchronization and calibration measurements but short enough that phase variations between the various WADC and WDAC integrated circuitry are not significant. Based on a 18 bit SFDR (or $4\times 10^{-6}$ precision) and $10^{-7}$ relative phase stabilities in the WADC and WDAC integrated circuitry, the interleaving cycle period can be as long as $40/f_0$. If an interleaving cycle period of $50/f_0$ is chosen as illustrated in FIG. 8B, it will allow a $30/f_0$ signal region (S), a $10/f_0$ reference region (R), $5/f_0$ transition regions (T), and signal overlap regions of $5/f_0$. The transition regions can be made shorter than $5/f_0$ if necessary. However, a $5/f_0$ period permits a very smooth gaussian transition and simple variable adder circuit design.

The reference regions (R), which are used to synchronize and calibrate the wavelet pathways within either the A or B channel, are chosen as $10/f_0$ to allow at least four wavelet convolutions from each wavelet pathway in the A or B channels to be taken. This provides sufficient data points from which the relative phase and gain errors, and associated clock errors of individual wavelet pathways within either the A or B channel are measured and corrected. The reference signal can be expressed as:

$$R = R_0 \cos((9/8)(t + \phi_p + 4\pi n)), \tag{21}$$

where $R_0$ is the fixed amplitude of the reference signal chosen to be at the maximum dynamic range so errors in the least significant bits can be detected. The quantity, t, is now time non-dimensionalized by $2\pi f_0$ so that phases are relative to the wavelet period. The quantity, $\phi_p$, is the phase shift of the pth wavelet pathway relative to the reference signal, and n designates the nth wavelet in the pth wavelet pathway. Thus the successive wavelets (based on the 50% duty cycle) in each pathway described by equation (1) become $$w_p(t) = a_p \cos(t) + b_p \sin(t) \tag{22}$$

on the interval $[0, 2\pi]$. This representation of the reference signal and wavelet are chosen to simplify further analysis. Errors in the sampling clocks in each wavelet pathway, referred to above, are designated $\delta_p$. These are the persistent errors over multiple wavelet cycles within each wavelet pathway and are thus not distinguished by the subscript n. They are calculated by the DSP as described below and corrected so that equation (4) is satisfied. As long as the sampling clock's timing jitter is within the constraints of equation (4), the DSP can calculate the persistent error and drive the sampling clocks to keep their total error within the constraints of equation (4). Under these conditions, the measured value of each wavelet convolution is $$m_{np} = R_0 \int_{\delta_p + \Delta_n}^{2\pi + \delta_p + \Delta_n} (a_p \cos(t) + b_p \sin(t)) \cos((9/8)(t + \phi_p + 4\pi n)) \, dt. \tag{23}$$

The choice of $10/f_0$ as the reference region period always allows four successive measurements, $$\frac{m_{np}}{R_0}, \frac{m_{n+1,p}}{R_0}, \frac{m_{n+2,p}}{R_0}, \text{ and } \frac{m_{n+3,p}}{R_0} \tag{24}$$

to be taken during each reference period for each pathway. The quantity, $\Delta_n$, represents an intentional small shift applied to the sampling clock for the first and second successive measurements. This shift is set to fixed value of about five times the timing jitter limit imposed by equation (4) and is used to resolve the sampling clock error, $\delta_p$.

Equation (23) can be expressed as $$\frac{m_{np}}{R_0} = a_p A(\phi_p + 4\pi n, \delta_p + \Delta_n) + b_p B(\phi_p + 4\pi n, \delta_p + \Delta_n), \quad (25)$$

where A and B are easily computed invariant sinusoidal functions have a period of $(9/8)2\pi$ with respect to the first argument. Their sinusoidal behavior with respect to second argument contains both $(17/8)2\pi$ and $(1/8)2\pi$ periodicities. The four measurements of expressions (24) are used to solve equations (25) for $$a_p, b_p \text{ and } \delta_p, \quad (26)$$

so that the sampling clock error can be corrected, wavelet phase can be corrected relative to the desired reference signal phase, $\phi_p$, and the wavelet pathway gain can be corrected relative to the reference signal magnitude, $R_0$. This over-determined system allows a robust calculation of $a_p$, $b_p$ and $\delta_p$ for any $\phi_p$. The desired relative phases of $\phi_p$ are 0°, 240°, 480° in each of the A and B channels. The relationship between the A and B channel phases is calculated by the use of the signal overlap region by a method described later. The specific method for the robust and accurate calculation of $a_p$, $b_p$ and $\delta_p$ to synchronize and calibrate each channel is divided into two phases: acquisition and maintenance.

The acquisition phase begins with default settings for sampler clock and wavelet generator phases and gains. These default settings need only be accurate enough to resolve cycle ambiguities, which implies default timing accuracies of $1/(2f_0)$. In the example cited above, with $f_0=66.67$ MHz, this corresponds to 7.5 ns which is easily achievable in any applicable integrated circuit fabrication technology. Equation (25) can be expressed as $$\hat{m}_0 = \Lambda_0 \hat{a}, \quad \hat{m}_\Delta = \Lambda_\Delta \hat{a} \quad (27)$$

where $\hat{m}_0 = \{m_{n+2,p}/R_0, m_{n+3,p}/R_0\}$ represents the third and fourth measurements without the intentional small phase shift and $\hat{m}_\Delta = \{m_{n,p}/R_0, m_{n+1,p}/R_0\}$ represents the first and second measurements with the intentional small phase shift. The wavelet vector $\hat{a} = \{a_p, b_p\}$ represents the wavelet phase and magnitude. The matrices $\Lambda_0$ and $\Lambda_\Delta$ are defined as $$\Lambda_0 = \begin{cases} A(\phi_p + 4\pi(n+2), \delta_p), & B(\phi_p + 4\pi(n+2), \delta_p) \\ A(\phi_p + 4\pi(n+3), \delta_p), & B(\phi_p + 4\pi(n+3), \delta_p) \end{cases} \quad (28)$$

and $$\Lambda_\Delta = \begin{cases} A(\phi_p + 4\pi(n+2), \delta_p + \Delta_n), & B(\phi_p + 4\pi(n+2), \delta_p + \Delta_n) \\ A(\phi_p + 4\pi(n+3), \delta_p + \Delta_n), & B(\phi_p + 4\pi(n+3), \delta_p + \Delta_n) \end{cases}. \quad (29)$$

Both $\Lambda_0$ and $\Lambda_\Delta$ have constant determinants and are robustly invertible. Therefore equations (27) can be combined to form $$\hat{m}_\Delta - \hat{m}_0 = \Gamma(\phi_p, \Delta_n; \delta_p) \hat{m}_0 \quad (30)$$

where $$\Gamma(\phi_p, \Delta_n; \delta_p) = (\Lambda_\Delta - \Lambda_0)\Lambda_0^{-1}. \quad (31)$$

Equation (30) provides a robust least squares formulation to calculate $\delta_p$ from within its initial default range. The function $\Gamma(\phi_p, \Delta_n; \delta_p)$ is a readily tabulated periodic function of $\delta_p$ and $\phi_p$ for any chosen value of $\Delta_n$; therefore least squares calculation is very rapid and will not tax DSP capability. With $\delta_p$ calculated by equation (30), the wavelet vector $\hat{a}$, is calculated by $$\hat{a} = \Lambda_0^{-1}(\phi_p, \Delta_n; \delta_p) \hat{m}_0 \quad (32)$$

where $\Lambda_0^{-1}(\phi_p; \delta_p)$ is a readily tabulated periodic function of $\delta_p$ and $\phi_p$. Several iterations of phase and magnitude adjustments based on the estimates defined by equations (27) through (32) bring the A and B channel wavelet pathways into alignment with the reference signal and complete the acquisition phase. This alignment is characterized by a $\hat{a}=\{0,1\}$ and $\delta_p=0$.

In the maintenance phase, a linearized version of equation (30) can be used since $\delta_p$ remains very small. Equation (30) is approximated as $$\hat{m}_\Delta - \hat{m}_0 = (\Gamma_0 + \Gamma_1 \delta_p)\hat{m}_0 \quad (33)$$

which results in a direct non-iterative least squares solution for $\delta_p$. Again, the wavelet vector $\hat{a}$, is calculated by equation (32) with $\delta_p=0$. In the maintenance phase, the wavelet vector, $\hat{a}$, is held at $\{0,1\}$ relative to the required reference phases, $\phi_p$.

The signal overlap regions between the A and B channels are used to calculate and correct the phase and gain errors of the A and B channels relative to each other. Using the signal flow definitions from FIG. 5A, the A and B channel outputs can be represented as $$c_{Bi} = c(t_i), \quad (34)$$

and $$c_{Ai} = (1+\epsilon)c(t_1 + \delta). \quad (35)$$

The gain error between the A and B channels is represented by $\epsilon$, and the phase error between the A and B channels is represented by $\delta$. For small $\epsilon$ and $\delta$, $$c_{Ai} - c_{Bi} \approx \epsilon c_{Bi} + \delta c'_{Bi}. \quad (36)$$

In order to calculate $\epsilon$ and $\delta$, we need an accurate estimate of $C'_{Bi}$. The is obtained from $$c'_{Bi} \cong \frac{c_{Bi+h} - c_{Bi}}{h}. \quad (37)$$

However, h must be less than about 10% of the Nyquist sampling interval to provide enough accuracy for feedback stability. Therefore, the additional wavelet generator (shown as $WG_{B3h}$) and its pathway must be employed. This additional wavelet generator is held at a fixed delay relative to $WG_{B3}$ using a phase adjustment calculated by the DSP. The signal overlap regions of $5/f_0$ result in two overlapping measurements with which equation (36) estimates $\epsilon$ and $\delta$. The longer signal overlap region can be employed to introduce and least-squares computation for $\epsilon$ and $\delta$. Only the third wavelet pathway of each the A and B channels is used to maintain A/B channel alignment.

Integrate and Hold ADC

Figure 9A:
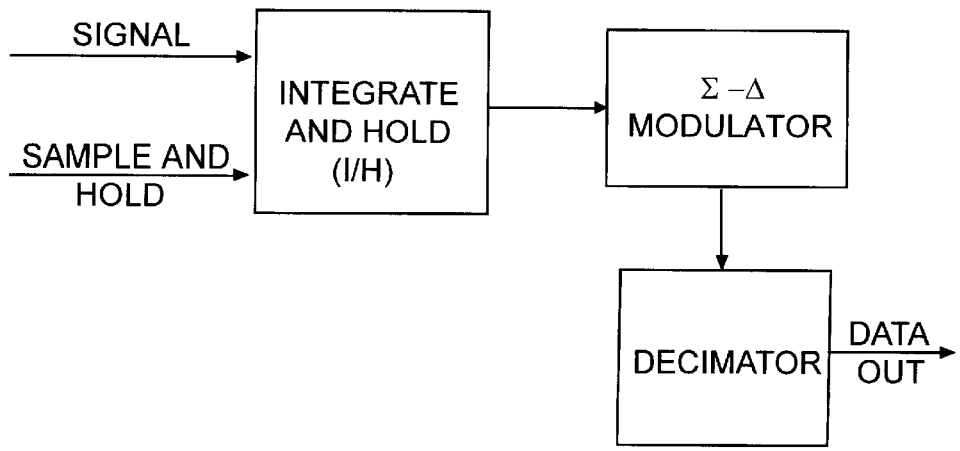
FIG. 9A is a schematic of an example integrate and hold analog-to-digital (I/H ADC) circuit comprising elements of the WADC and WDAC circuits.
Figure 9B:
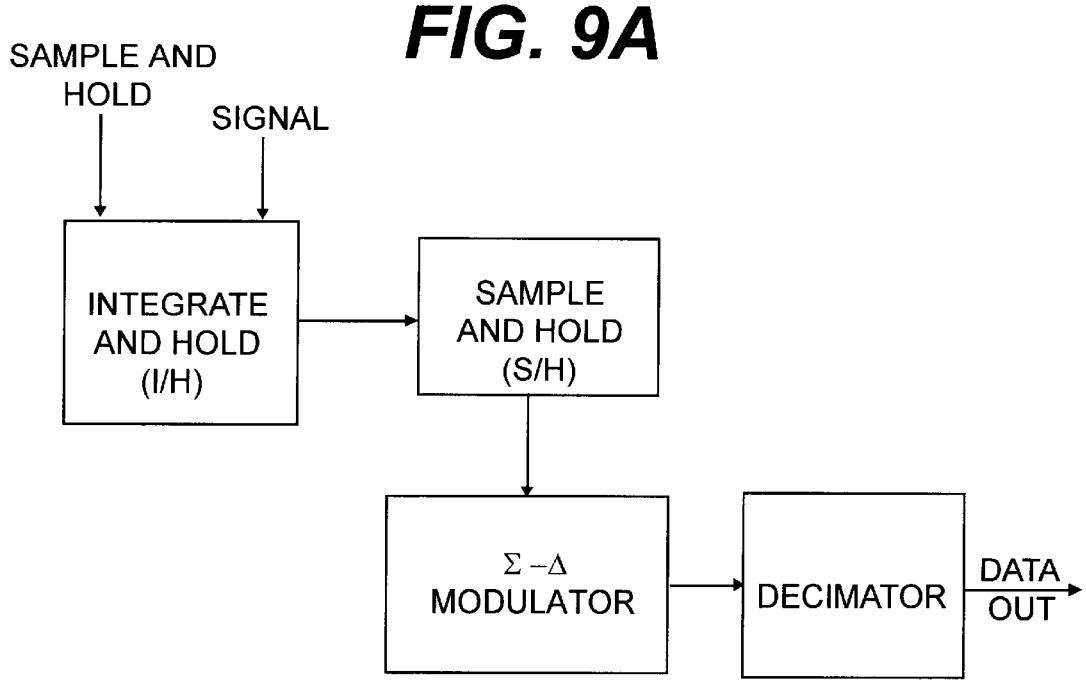
FIG. 9B is a schematic of an alternative I/H ADC circuit design including a sample-and-hold transfer circuit.

The integrate-and-hold analog-to-digital circuit (I/H ADC) used in the wavelet pathways receives a signal, which it integrates, holds and digitizes. The sample and hold input causes the I/H ADC to initiate a new integration cycle and digitize the previous integration cycle. As in the basic wavelet-based analog-to-digital and digital-to-analog converter concept of my co-pending application Ser. No. 09/669,693, a key attribute of the present invention is the elimination of the need for sample-and-hold (S/H) circuits to quickly transfer signal energy. Only integrate-and-hold circuits (I/H), which transfer and hold much more energy per sample than S/H circuits of the same impedance, are required. As a result, the present invention has a much greater immunity to thermal noise than prior art using sample-and-hold circuits. Furthermore, the I/H circuits do not require disconnecting a capacitor from the input signal as S/H circuits do. The I/H circuits go into the hold mode simply by holding the integrator input at zero when the wavelet convolution input has reached its end point, which is zero. This also contributes to making the I/H circuits more accurate than S/H circuits. FIG. 9A illustrates a simple embodiment of the I/H ADC. It contains an Integrate and Hold (I/H) circuit, a $\Sigma$-$\Delta$ modulator and a decimator to digitize the wavelet convolution. Alternate configurations include pipeline converters in conjunction with I/H circuits. Integrated-and-held samples are presented for final digitization at only a rate only $f_0/2$. For the 70 MHz IF, 30 MHz BW, 100 MSPS example discussed above, the final digitization rate is then 33.33 MSPS and the I/H circuit presents a final steady state value to the $\Sigma$-$\Delta$ modulator (or other final digitization stage) for 15 ns. If a longer steady state period is required by the final digitization stage, a sample and hold circuit (S/H) can be inserted between the I/H circuit and the final digitization stage as shown in FIG. 9B. In this case, the 100 MSPS example mentioned just previously, would present the final digitization stage with a steady state value for 30 ns. It should be noted here that the S/H circuit in FIG. 9B would not suffer from the same limitations as those used in prior art analog-to-digital converter technology because it is not subject to precise timing requirements. Achieving a 200 MSPS design within the 70 MHz IF, 30 MHz BW example above requires the use of either (1) a 100% duty cycle within each wavelet pathway, or (2) 6 wavelet pathways within each channel. In the 100% duty cycle case, the I/H ADC structure must include a S/H transfer stage such as in FIG. 9B, or a dual I/H ADC structure such as described in the basic wavelet-based analog-to-digital and digital-to-analog converter concept of my co-pending application Ser. No. 09/669,693. The use of second option, 6 wavelet pathways within each channel, increases the total circuit complexity, but decreases the performance required of each I/H ADC circuit.

Since all synchronization and calibration is accomplished through phase and gain corrections calculated by the DSP for the entire system, the I/H ADC need only provide linearity and the specified converter SNR as a dynamic range.

Embodiments of the present invention are not limited to using $\Sigma$-$\Delta$ modulators at the final digitization stage. They may also include tightly integrated I/H ADC designs in which the I/H and ADC stages are not distinct.

Computational Load on DSP

In specific embodiment discussed above, the total computational load imposed on the DSP for synchronization and calibration of the WADC and WDAC is typically only several floating point operations per sample. This load is insignificant compared with the application signal processing load on the DSP and therefore can be accommodated easily.

Advantages

The present invention provides a method and circuit for direct intermediate frequency sampling analog-to-digital and digital-to-analog signal conversion at combinations of sampling rates and bit resolutions previously not possible. This results in a combination of high bandwidth, high SNR, and high SFDR not previously attainable. In the present invention, analog circuitry generates highly precise wavelets, which decompose analog signals into digital signals and compose digital signals into analog signals. The present invention also includes methods and circuits to synchronize and calibration the wavelet decomposition and composition operations to produce the required precision.

The present invention overcomes the limitations in prior art by decomposing the analog signal into a set of wavelet functions rather than sampling it in the time domain. This wavelet decomposition allows for the detection and correction of extremely small timing errors and thus overcomes the timing jitter limitations of other analog-to-digital converter technology. In addition, the wavelet decomposition integrates signal energy over much longer periods than the time domain sampling. As a result, each element of the wavelet-decomposed signal contains much more energy than each sample in a time domain sampling approach and therefore is much less affected by thermal noise.

Conclusions, Ramifications, and Scope

Accordingly, the reader can see that the present invention of a direct intermediate frequency sampling wavelet-based analog-to-digital and digital-to-analog converter provides the high-fidelity associated with modern analog radio-frequency integrated circuit technology and the full flexibility of digital signal processing simultaneously. This unique combination addresses the most critical limitation to fully flexible wide-band software defined radio (SDR) basestations—high speed, high fidelity analog/digital conversion. The WADC/WDAC also allows a wireless basestation to cover its entire frequency band, including multiple waveform standards, with one fully flexible WADC/WDAC for each antenna element. This permits a wireless basestation to be smaller and less expensive while handling multiple waveform standards simultaneously. The WADC/WDAC also enables software upgrades to future wide-band waveforms with higher spectral efficiencies and dynamically adaptive waveforms.

Although the description above contains many specificities, these should not be construed as limiting the scope of the invention but as merely providing illustrations of some of the presently preferred embodiments of this invention. For example, the cited frequencies, bandwidths, sample rates and timing errors are based on implementing the present invention using commercially available and practical semiconductor technologies. As faster and smaller semiconductor technologies emerge, the embodiment of the present invention will implement circuit design elements appropriate to those technologies and produce higher sample rates, higher bit resolution, smaller physical size and lower power consumption. Also, while SDR is a major application of the present invention, other applications include high-speed modems for wire and coaxial cable networks.

Thus the scope of the invention should be determined by the appended claims and legal equivalents, rather than by the examples given.

I claim:

1. A system and circuit for direct intermediate frequency sampling analog-to-digital, and digital-to-analog signal conversion using digitally synchronized and calibrated analog-circuit generated wavelets to achieve identical wavelet shapes and amplitudes and to achieve precisely controlled phase relationships among the wavelets to reduce timing jitter and improve the Signal to Noise ratio.

2. A method to maintain precise synchronization and calibration among multiple analog wavelet circuit pathways decomposing or composing an analog wavelet signal using a combination of a periodically applied reference signal and the signal of interest to determine synchronization and calibration errors to reduce timing jitter and improve the Signal to Noise ratio.

3. A wavelet system suitable for high sample-rate high resolution digitally synchronized and calibrated direct intermediate frequency sampling analog-to-digital and digital-to-analog conversion having both wide intermediate frequency bandwidth and insensitivity to sample timing errors.

* * * * *